United States Patent [19]

Van Lammeren et al.

[11] Patent Number: 4,998,074

[45] Date of Patent: Mar. 5, 1991

[54] TRANSISTOR CIRCUIT WITH BASE-CURRENT COMPENSATION

[75] Inventors: Johannes P. M. Van Lammeren; Armand M. Stuivenwold; Henricus T. P. J. Van Elk, all of Nijmegen, Netherlands

[73] Assignee: U.S. Philips Corporation, New York, N.Y.

[21] Appl. No.: 416,575

[22] Filed: Oct. 3, 1989

[30] Foreign Application Priority Data

Oct. 26, 1988 [NL] Netherlands ............... 8802632

[51] Int. Cl.$^5$ ............................................. H03F 3/45
[52] U.S. Cl. ....................................... 330/252; 330/261
[58] Field of Search ................................. 330/252, 261

[56] References Cited

U.S. PATENT DOCUMENTS 3,714,600  1/1973  Kuijk et al. ..................... 330/288

OTHER PUBLICATIONS

Commander, "Magnetic Head Preamplifier", *IBM Technical Disclosure Bulletin*, vol. 16, No. 5, Oct. 1973, pp. 1657, 1658.
Voorman et al., "Integration of Analog Filters in a Bipolar Process", IEEE Journal of Solid State Circuits, vol. SC-17, No. 4, Aug. 1982, pp. 713-722.

*Primary Examiner*—James B. Mullins
*Attorney, Agent, or Firm*—Bernard Franzblau

[57] ABSTRACT

An emitter-coupled transistor pair consisting of a first (T1) and a second (T2) transistor in which the a.c. component (+ib) in the base-current of the first transistor is compensated for by the a.c. component (−ib) of the second transistor. A replica of the later a.c. component (−ib) is available in the base-current of a third transistor (T3) which has its collector-emitter path connected in the collector line of the second transistor and which has its base coupled to the base of the first transistor.

8 Claims, 3 Drawing Sheets

TRANSISTOR CIRCUIT WITH BASE-CURRENT COMPENSATION

BACKGROUND OF THE INVENTION

This invention relates to a transistor circuit comprising an emitter-coupled transistor pair comprising a first and a second transistor, and a third transistor to compensate for the base-current of the first transistor, which third transistor has its collector-emitter path arranged in series with the collector-emitter path of one of the transistors of the transistor pair.

Such a transistor circuit is disclosed in U.S. Pat. No. 3,714,600. This prior-art transistor circuit comprises an emitter-coupled transistor pair, the base-current of the first transistor being compesated for by the base-current of a third transistor having its collector-emitter path arranged in the collector line of the first transistor. The base-current compensation causes the impedance at the base of the compensated first transistor to increase so that the load on the signal source to which said base in coupled is reduced substantially. The base-current of the second transistor can be compensated for identically.

In gyrator-capacitor filters, which are described, inter alia, in "Integration of Analog Filters in a Bipolar Process", IEEE Journal of Solid-State Circuits, Vol. SC-17, No. 4, Aug. 1982, pp. 713–722, the emitter-coupled transistor pair is an important element, which is often referred to as a transconductance circuit or transconductor, the voltage difference between the bases of the transistors of one pair being converted into two balanced output currents. By coupling two emittercoupled transistor pairs a gyrator can be formed. The quality and precision of the gyrator-capacitor filters depends inter alia on the manner in which a gyrator loads the other filter components, such as capacitors, resistors and other gyrators. In the ideal case a gyrator comprises two transconductors each having an infinitely high input impedance such that the transconductors neither load one another nor the filter components coupled to the gyrator. A high input impedance might be obtained by base-current compensation as used in the prior art transistor circuit. However, the prior-art transistor circuit requires a current mirror for the purpose of base-current compensation. The transistors of this current mirror are of a conductivity type opposite to that of the transistor in the imetter-coupled transistor pair. In integrated circuits such transistor pairs are formed by NPN transistors on account of thier superior signal-amplifying properties. This means that PNP transistors will be needed for the current mirror. The currents in the PNP current mirror should be most faithful replicas of the base current of the transistor to be compensated. However, PNP transistors have a lower current gain and an inferior high-frequency performance in comparison with NPN transistors. Therefore, a current mirror comprising PNP transistors is less accurate and less suitable for use at high frequencies.

SUMMARY OF THE INVENTION

It is an object of the invention to provide an emitter-coupled transistor pair employing base-current compesantion wihout the use of current mirrors.

According to the invention a transistor circuit of the type defined in the opening paragraph is characterized in that the collector-emitter path of the third tansistor is arranged in series with the collector-emitter path of the second transistor and in that the base of the third transistor is coupled to the base of the first transistor.

In an emitter-coupled transistor pair the a.c. components in the base currents of the first and the second transisitor are equal but in phase opposition. The d.c. components are also equal but in phase. By arranging the coollector-emitter path of the third transistor in series with the collector-emitter path of the second transistor a current is obtained which is in phase with the base-current of the second tranistor. By coupling this current to the base of the first transistor, the a.c. component in the base-current of the first transistor is compensated for, while the d.c. component, which is of no further influence on the signal gain, is doubled. Thus, the a.c. impedance at the base of the first transistor is high at the expense of a doubled d.c. component. However, in gyrator-capacitor filters this doubled d.c. base current of compensated transistor can be allowed for simply in the desing the gyrator-bias circuits. This method of base-current compensation does not require the use of current mirrors comprising PNP transistor so that the undesirable effects of such current mirrors are avoided.

If required, the base-current of both the first and the second transistor of the emitter-coupled transistor pair can be compensated for by the method in accordance with the invention. In gyrator-capacitor filters the gyrators and the first components coupled thereto are generally not floating but have one end coupled to a reference voltage. In that case it is necessary to provide base-current compensation for those bases of the emitter-coupled transistor pairs which are coupled to the reference potential. This is because their alternating currents do nto load other gyrators of filter components and therefore do not affect the quality and accuracy of the gyrator-capacitor filter.

A gyrator with base-current compensation for gyrator-capacitor filters is obatined in a first further embodiment of the transistor circuit in accordance with the invention which is characterized in that the transistor circuit further comprises an emitter-coupled transistor pair comprising a fourth and a fifth transistor, a sixth transistor, whose collector-emitter path is arranged in series with the collector-emitter path of the fifth transistor and which has its base coupled to the base of the fourth transistor, the base of the second transistor being coupled to the collector of the fourth transistor, the base of the first transistor being coupled to the collector of the sixth transistor, the base of the fourth transistor being coupled to the collector of the first transistor, and the base of the first transistor being coupled to the collector of the third transistor.

In this gyrator compensation is provided only for the base-currents of the first and the fourth transistor in the two emitter-coupled transistor pairs. The two other bases of the transistor pairs can be coupled to a reference voltage and therefore require no compensation. A gyrator-capacitor filter is obtained by arranging a suitable impedance between the bases of the first and the second transistor and between the bases of the fourth and fifth transistor. For example, if a capacitor is selected for these impedances, an LC resonator is obtained whose selectivity is very high on account of the compensation of the base-currents of the first and the fourth transistor.

Signal points whose operating potentials are too far apart, such as for example the collector of the sixth transistor and the base of the first transistor, are coupled via a level-shifting circuit. In a second further embodiment of the transistor circuit two emitter-coupled transistor pairs are coupled to form a gyrator which simply combines base-current compensation and level-shifting. For this purpose the transistor circuit in accordance with the invention is characterized in that the transistor circuit further comprises a fourth transistor having its collector-emitter path arranged in series with the collector-emitter path of the third transistor, an emitter-coupled transistor pair comprising a fifth and a sixth transistor, a diode-connected seventh transistor and a diode-connected eighth transistor, whose collector-emitter paths are arranged in series with the collector-emitter path of the sixth transistor, the base of the third and the seventh transistor being coupled to each other and the bases of the fourth and the eight transistor being coupled to each other, the base of the first transistor being coupled to the collector of the sixth transistor and the base of the fifth transistor being coupoled to the collector of the first transistor, and the bases of the second and the sixth transistor and the collectors of the fourth and fifth transistor being coupled to a reference-voltage terminal.

By coupling the bases of the second and the sixth transistor to a suitable reference voltage, base-current compensation need be provided only for the first and the fifth transistor. The base-emitter juction of the seventh transistor functions as a level shifter for the base-current of the third transistor. The collector-emitter path of a fourth transistor is arranged in series with the third transistor and its base-current is transferred to the base of the first transistor via the base-emitter junction of the eighth transistor, which serves as a level shifter, and via seventh transistor. In this way the base-current of the first transistor is compensated for twice. However, the base-current of the fifth transistor is not compensated for. When this gyrator is employed in a gyrator-capacitor filter a first and a second impedance are coupled to the base of the first and the fifth transistor, respectively. The surplus of compensation current for the base-current of the first transistor flows to the first impedance, the deficient compensation current for the base-current of the fifth transistor being taken from the second impedance. The surplus and the deficiency thus compensate for one another wholly, or at leas partly. This gyrator does not load the filter components, or does so as least to a smaller extent than a gyroator comprising similar transistor pairs without base-current compensation.

BRIEF DESCRIPTION OF THE DRAWINGS

The invention will now be described in more detail, by way of example, with reference to the accompanying drawings, in which.

DESCRIPTION OF THE PREFERRED EMBODIMENT

Figure 1A:
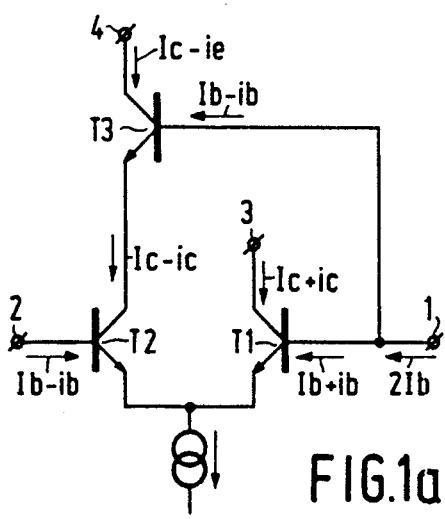
FIGS. 1a-1c shows four embodiments of a transistor circuit in accordance with the invention.
Figure 1B:
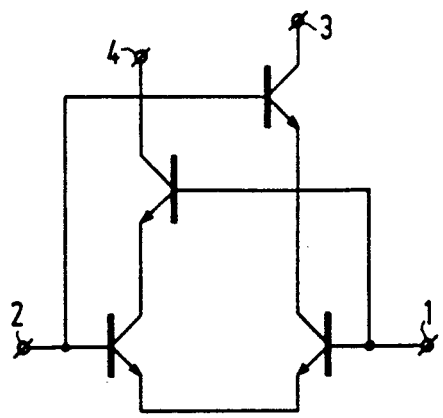

FIG. 1a showns an emitter-coupled transistor pair T1, T2 in accordance with the invention. The emitters of T1 and T2 are coupled to a bias-current source, whose current is equally divided between the transistors T1 and T2, so that a quiescent current Ic flows in the collectors of both transistors T1 and T2. The base of the transistor T1 is coupled to a terminal 1 and the base of the transistors T2 is coupled to a terminal 2. A voltage difference is applied across the terminals 1 and 2 causing base-currents to flow in the transistors T1 and T2. As a result of the symmetry of the transistor pair T1, T2 the a.c. components ib in these currents are in phase opposition. Conversely, the d.c. components Ib are in phase. A current Ib+ib flows in the base of the transistor T1 and a curretn Ib−ib flows in the base of the transistor T2. In the transistors T1 and T2 the a.c. components ib and −ib are amplified by a specific current-gain factor, resulting in balanced collector currents ic and −ic respectively. The collector current ic is availabel on the terminal 3, which is coupled to the collector of the transistor T1. The collector-emitter path of the transistor T3 is arranged in series with the collector-emitter path of the transistor T2. The emitter of the transistor T3 is coupled to the collector of the transistor T2 and the collector of the transistor T3 is coupled to a terminal 4. The collector current −ic of T2 flows through the transistor T3 and is available at the terminal 4. The a.c. current component in the base of the transistor T2. The same applies to the d.c. component of the base-current of the transistor T3. Consequently, the total current in the base of the transistor T3 is substantially equal to Ib−ib. The base of the transistor T3 is coupled to the base of the transistor T1. As a result of this coupling the a.c. component +ib in the base current of the transistor T1 is compensated for by the a.c. component −ib in the base-current of the transistor T3. Thus, only a d.c. component 2*Ib will flow in terminal 1. As a result of the compensation for the a.c. component the a.c. impedance, seen at the terminal 1, is high. If required, the a.c. component in the base-current of the transistor T2 can be compensated for in the same way, as shown in FIG. 1b, by arranging a transistor in the collector line of the transistor T1. This method of compensation results in an emitter-coupled transistor pair with a high a.c. impedance at both the terminals 1 and 2.

Figure 1C:
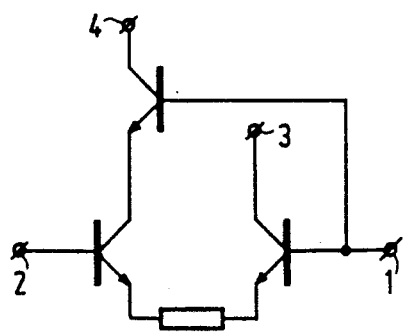
Figure 1D:
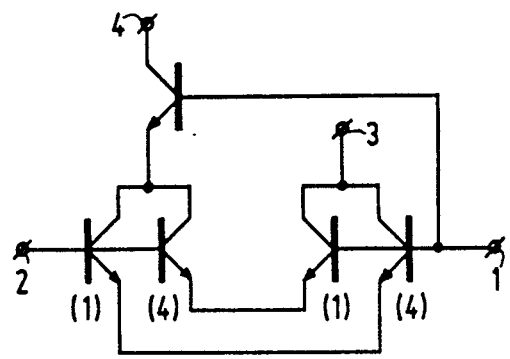

FIGS. 1c and 1d show modifications of emitter-coupled transistor pairs with base-current compensation. In these Figures corresponding reference numerals have the same meaning as in FIG. 1a. In the transistor pair shown in FIG. 1c the emitters are coupled to a resistor and a bidirectional current path extends between the bases of transistors T3 and T1. In FIG. 1d the collectors and the bases of two emitter-coupled transistor pairs are interconnected. The relative emitter area of each of the transistors is given in brackets. Such a configuration provides a more linear voltage-to-current conversion than the transistor pair of FIG. 1a. It will be evident that the base-current compensation is not limited to emitter-coupled transistor pairs as shown in FIG. 1.

A gyrator comprises two mutually coupled voltage-to-current converters, also referred to as transconductors. The voltage-to-current covnerter is then constituted by an emitter-coupled transistor pair to convert the voltage difference on the bases of the transistors of the pair into balanced collector currents. Such voltageto-current converters requre a high input impedance in order to obtain a loss-free gyrator. A gyrator which is not loss-free may also be used to realize a specific gyrator filter but presents a load to the filter components connected to the gyrator. Generally, the gyrator filter will then operate less accurately than anticipated. In particular, if very selective gyrator filters are needed it is essential that the gyrator does not load the filter components. The emitter-coupled transistor pairs shown in FIG. 1 are therefore very suitable as voltage-to-current converters in gyrator filter circuits because of their high input impedance.

Figure 2A:
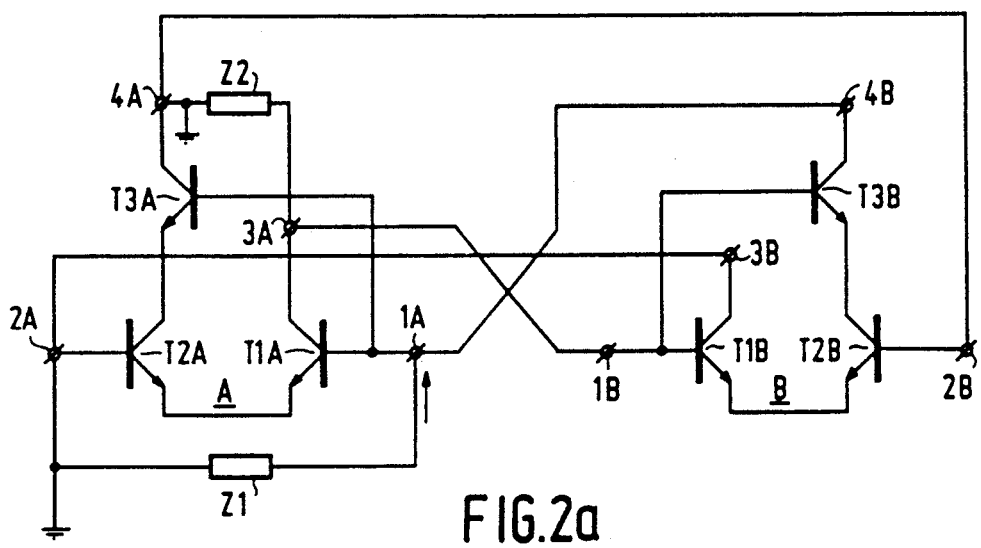
FIGS. 2a and 2b show two circuit diagrams of a fifth embodiment of a transistor circuit in accordance with the invention, and FIGS. 3 and 4 shown circuit diagrams of a sixth embodiment of a transistor circuit in accordance with the invention.
Figure 2B:
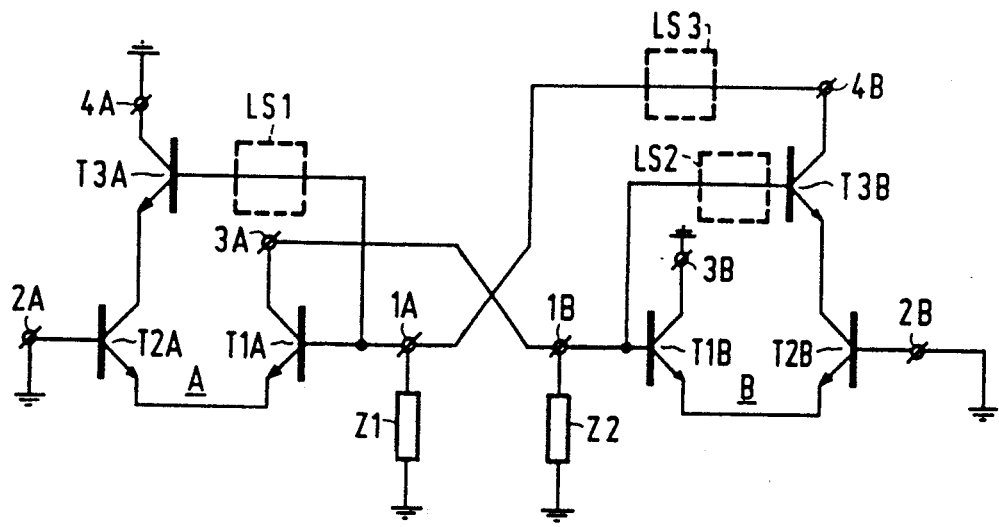

FIG. 2a shows the a.c. diagram of a gyrator comprising two identical emitter-coupled transistor pairs A and B with base-current compensation, each of which by way of example are constructed as the modification in FIG. 1a. The reference numerals have the same meaning as in FIG. 1a, but to distinghuish between the two pairs A and B the corresponding parts of the pairs A and B have reference numerals suffixed with A and B. The terminals 3A and 1B, 1A and 4B, 2A and 3B, and 4A and 2B are coupled to each other so that the transistor pairs A and B together act as a gyrator. An impedance Z1 is connected across the terminals 1A and 2A and an impedance Z2 is connected across the terminals 3A and 4A. If Z1 and Z2 are capacitors the gyrator-filter circuit will behave as an LC parallel resonant circuit between the terminals 1A and 2A. FIG. 2a further shows that the impedances Z1 and Z2 may have one of their ends connected to a suitable reference voltage, for example, ground. For this situation the circuit of FIG. 2a is shown in FIG. 2b in such a way that it is easier to see which terminals of the gyrator circuit are coupled to the reference voltage. It will be seen that the transistors T1A and T1B load the filter components Z1 and Z2, so that base-current compensation need only be provided for the transistors T1A and T1B. Coupling the bases of the transistors T3A and T3B to the bases of the transistors T1A and T1B respectively and terminal 4B to terminal 1A requires the use of level shifters, for example, diode-connected transistors, which are referenced LS1, LS2 and LS3. This is because the signal points to be coupled are at different operating potentials.

Figure 3:
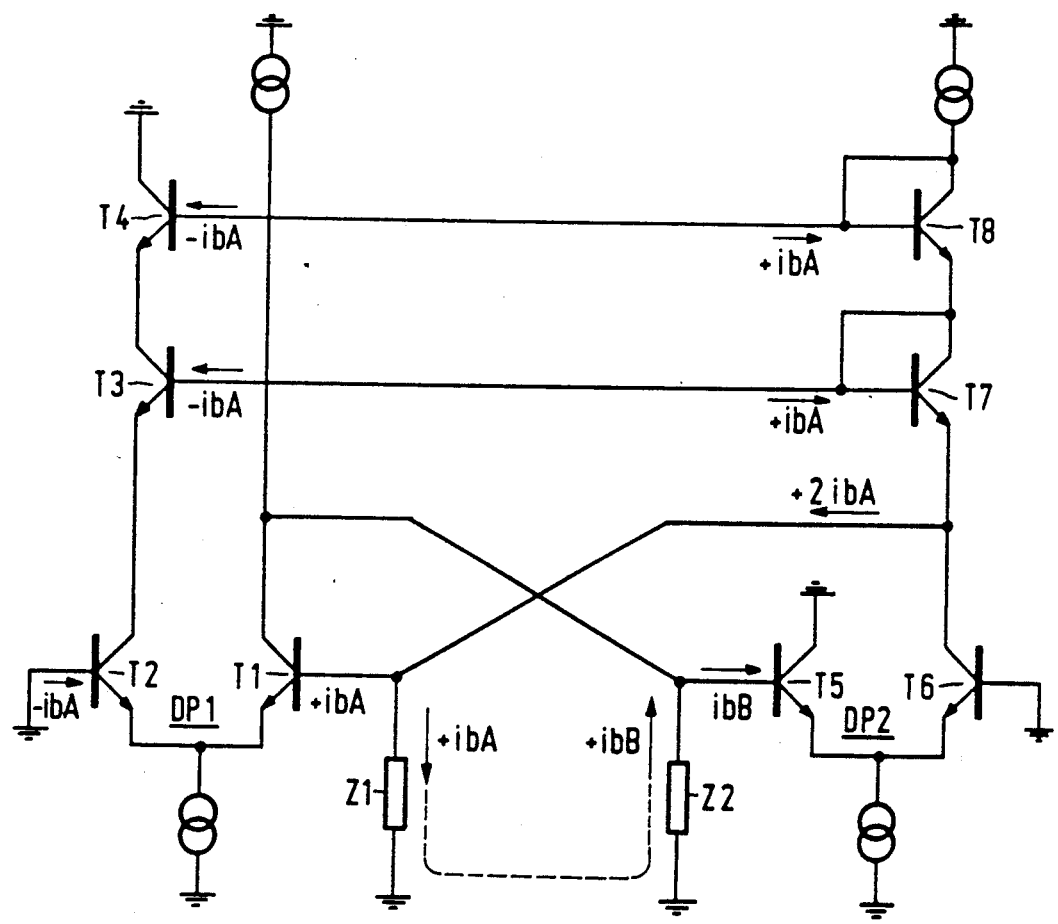

FIG. 3 shows the a.c. diagram of a transistor circuit in accordance with the invention, which combines the base-current compensation and the level shifters shown in FIG. 2b. The gyrator comprises two emitter-coupled transistor pairs DP1, comprising the transistors T1, T2, and DP2, comprising the transistors T5 and T6. The transistor T1 has its base coupled to the collector of the transistor T6 and the transistor T5 has its base coupled to the collector of the transistor T1. The bases of the transistors T1 and T5 are coupled to a suitable reference voltage via the impedances Z1 and Z2, respectively. The bases of the transistors T2 and T6 and the collectors of the transistors T4 and T5 are also coupled to the reference voltage. This again results in a gyrator-filter circuit whose operation is basically identical to that of the circuit shown in FIG. 2. The collector-emitter paths of the transistors T3 and T4 are arranged in the collector line of the transistor T2. Two diode-connected transistors T7 and T8 are arranged in the collector line of the transistor T6 and have their bases coupled to the bases of the transistors T3 and T4. In accordance with the principle as set forth in the explanation of the base-current compensation used in the circuit shown in FIG. 1a, the base of the transistor T3 is coupled to the base of the transistor T1, level shifting being provided by the transistor T7. By means of the transistor T4, however, another compensation current is generated which is also applied to the base of the transistor T1 via a transistor T8, which again functions as a level shifter, and the transistor T7. An alternating current $+i_{bA}$ in the base-current of the transistor T1 results in an alternating current $2*i_{bA}$ in the emitter line of the transistor T7, which current divides into the base-current $i_{bA}$ to the transistor T1 and a current $i_{bA}$ which flows into the impedance Z1. In fact, this provides overcompensation for the basecurrent of the transistor T1. However, the base-current $i_{bB}$ of the transistor T5 is not compensated for by a transistor, corresponding to the transistor T3, in the collector line of the transistor T6. Consequently, a current $i_{bB}$ is sunk from the impedance Z2. Sourcing the current $i_{bA}$ to the impedance Z1 and sinking the current $i_{bB}$ from the impedance Z2 results, on the average, in the filter components Z1 and Z2 being hardly loaded by the gyrator if the currents $i_{bA}$ and $i_{bB}$ are substantially equal. But even in the case of unequal currents $i_{bA}$ and $i_{bB}$ a load reduction is achieved as compared with a similar kind of gyrator filter, but without base-current compensation.

Instabilities may occur in the compensation loop T1, T2, T3, T4, T8 and T7, for example, owing to phase shifting in the impedance Z1. This causes the signal voltage on the base of the transistor T1 to increase. This signal voltage appears in amplified form but in phase opposition on the collector of the transistor T1. This amplified signal voltage is again amplified by the transistor pair T5, T6 but without any further phase shift. Thus, an inverted and amplified signal voltage will appear on the collector of the transistor T6, which counteracts the increasing signal voltage on the base of the transistor T1. The inverting loop gain from the base of the transistor T1 to the collector of the transistor T6 is several times higher than the noninverting loop gain in the compensation loop. In this way any oscillation tendencies are suppressed effectively.

Figure 4:
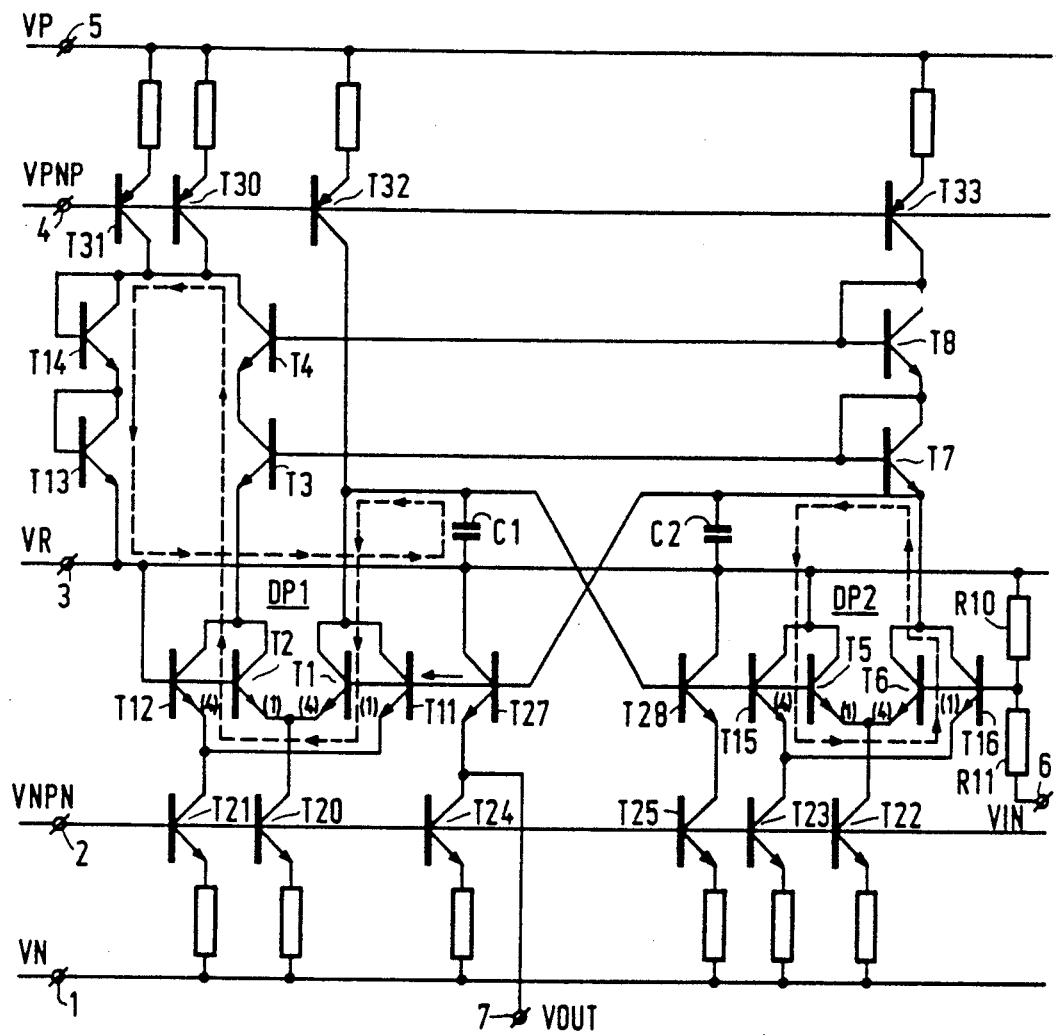

FIG. 4 shows the circuit diagram of an embodiment of the gyrator filter circuit as shown in FIG. 3, which also shows the bias means. In this Figure corresponding reference numerals denote the same elements as in FIG. 3. The transistors T1 to T8 are coupled similarly to those in the circuit shown in FIG. 3 and, by way of example, a capacitor C1 and a capacitor C2 have been selected for the impedances Z1 and Z2 respectively of the circuit shown in FIG. 3. The base-collector junctions of the transistors T12, T11, T15 and T16 are arranged in parallel with the base-collector junctions of the transistors T2, T1, T5 and T6 respectively. The emitters of the transistor pairs T1-T2, T11-T12, T5-T6 and T15-T16 are connected to a negative power supply terminal 1 by means of NPN current-source transistors T20, T21, T22 and T23 respectively and a resistor arranged in the emitter lines of each of these current-source transistors. The emitter areas of the transistors T12, T2, T1, T11 and of the transistors T15, T5, T6, T16 are in a ratio of 4:1:4:1 to one another. This provides a more linear voltage-to-current conversion in the emitter-coupled transistor pairs DP1 and DP2. The bases of the transistors T12, T2, T6 and T16 are coupled to a reference-voltage terminal 3, to which a suitable reference voltage VR is applied. The capacitors C1 and C2 also have one end connected to this reference-voltage terminal. The collectors of the transistors T4, T1 and T8 are connected to a positive power-supply terminal 5 via PNP current-source transistors T30, T32 and T33 respectively and a resistor arranged in the emitter line of each of said current-source transistors. The signal voltage on the base of the transistors T1 and T5 is available in buffered form on the emitters of the transistors T27 and T28 respectively, whose bases are connected to the bases of the transistors T1 and T5 respectively, whose collectors are connected to the reference-voltage terminal 3 and whose emitters are connected to the negative power-supply terminal 1 via NPN current-source transistors T24 and T25 respectively and a resistor arranged in the emitter line of each of said current source transistors. The collectors of the transistors T5, T15, T27 and T28 are connected to the reference-voltage terminal 3. The bias current for the transistors T15 and T5 is supplied to the reference-voltage terminal by a PNP current-source transistor T31, which has its emitter connected to the positive power-supply terminal via a resistor. The collector of the transistor T31 is connected to the collector of the transistor T4 and, via two diode-connected transistors T13 and T14, to the reference voltage terminal 3. The bases of the PNP and NPN current-source transistors are connected to the terminals 4 and 2 respectively, to which suitable bias voltages VPNP and VNPN respectively are applied. The a.c. component in the transistors T2 and T12 flows to the reference-voltage terminal 3 via the transistors T3, T4, T14 and T13. The a.c. component in the transistors T1 and T11 flows to the reference-voltage terminal 3 via the capacitor C1. As their two a.c. components are in phase opposition the voltage source connected to the reference-voltage terminal 3 is not loaded by these alternating currents. In the circuit diagram the circuit for these currents is indicated in broken lines. The a.c. component in the transistors T6, T16 flows to the reference-voltage terminal 3 via the capacitor C2. However, the opposite a.c. component in the transistors T15, T5 again presents an opposite load to the reference-voltage terminal 3. The circuit for this a.c. component is also indicated in broken lines. On account of the capacitors C1 and C2 the gyrator filter behaves as an LC parallel resonator and can be employed as a band-pass filter. For this purpose the base of the transistor T6 is connected to an input terminal 6 via resistor R11 and to the reference-voltage terminal 3 via a resistor R10. The signal VIN to be filtered is then applied to the input terminal 6. The output signal VOUT is available on an output terminal 7 connected to the emitter of the buffer transistor T27. Since the input impedances at the bases of the buffer transistors T27 and T28 are inherently very high, it is not necessary to compensate for the base-currents of the transistors T27, T28. In principle, the collector currents of the transistors T27 and T28 are not balanced. Nevertheless the resulting load presented by these currents to the reference voltage terminal 3 is small. Therefore, the entire circuit presents a very small a.c. load to the reference voltage terminal 3. Thus, it is simpler to keep the reference voltage VR free from interference.

The invention is not limited to the embodiments shown herein and is neither limited to use in gyrators and in gyratorcapacitor filters formed by means of such gyrators. The invention can readily be applied by those skilled in the art to various circuits in which base-current compensation for emitter-coupled transistor pairs is useful.

We claim:

1. A compensated transistor circuit comprising: first and second transistors having their emitters coupled together to form an emitter-coupled transistor pair,
singal input means coupled to base electrodes of said first and second transistors,
a third transistor having a collector-emitter path connected in series with a collector-emitter path of the second transistor, and
a bidirectional current path extending between a base electrode of the third transistor and the base electrode of the first transistor thereby to provide base current compensation for the first transistor.

2. A compensated transistor circuit as claimed in claim 1 further comprising a fourth transistor having a collector-emitter path connected in series with a collector-emitter path of the first transistor, and
a second bidirectional current extending between a base electrode of the fouth transistor and the base electrode of the second transistor thereby to provide base current compensation for the second transistor.

3. A compensated transistor circuit as claimed in claim 1 wherein the emitters of said first and second transistors are coupled together via an impedance element.

4. A compensated transistor circuit as claimed in claim 1 wherein said bidirectional current path comprises a direct connection between the base electrodes of the first and third transistors.

5. A compensated transistor circuit as claimed in claim 1 further comprising a constant current source connected in series with the series connected collector-emitter paths of the second and third transistors.

6. A compensated transistor circuit as claimed in claim 1 further comprising:
fourth and fifth transistors having their emitters coupled together to form a second emitter-coupled transistor pair,
means coupling collector electrodes of the second and fifth transistors together and further coupling collector electrodes of the first and fourth transistors together,
means coupling base electrodes of the second and fifth transistors together and further coupling base electrodes of the first and fourth transistors together, and wherein
the ratio of the emitter area of the second transistor to the emitter area of the fifth transistor is the same as that of the fourth transistor to the first transistor, said ratio being other than unity.

7. A transistor circuit comprising:
an emitter-coupled transistor pair comprising a first and a second transistor,
a third transistor to compensate for the base current of the first transistor, said third transistor having a collector-emitter path connected in series with the collector-emitter path of the second transistor and a base coupled to a base of the first transistor,
a second emitter-coupled transistor pair comprising a fourth and a fifth transistor,
a sixth transistor whose collector-emitter path is connected in series with a collector-emitter path of the fifth transistor and which has its base coupled to a base of the fourth transistor, and wherein
the base of the second transistor is coupled to a collector of the fourth transistor, the base of the first transistor is coupled to the collector of the sixth transistor, the base of the fourth transistor is coupled to the collector of the first transistor, and the base of the fifth transistor is coupled to the collector of the third transistor.

8. A transistor circuit comprising:
an emitter-coupled transistor pair comprising a first and a second transistor,
a third transistor to compensate for the base current of the first transistor, said third transistor having a collector-emitter path connected in series with the collector-emitter path of the second transistor and a base coupled to a base of the first transistor,
a fourth transistor having its collector-emitter path connected in series with the collector-emitter path of the third transistor,
a second emitter-coupled transistor pair comprising a fifth and a sixth transistor,
a diode-connected seventh transistor and a diode-connected eighth transistor, whose collector-emitter paths are connected in series with the collector-emitter path of the sixth transistor,
the bases of the third and the seventh transistor being coupled to each other and the bases of the fourth and the eighth transistor being coupled to each other,
the base of the first transistor being coupled to the collector of the sixth transistor and the base of the fifth transistor being coupled to the collector of the first transistor, and
the bases of the second and the sixth transistor and the collectors of the fourth and the fifth transistor being coupled to a reference voltage terminal.

* * * * *